United States Patent
Iino et al.

(10) Patent No.: US 6,207,259 B1
(45) Date of Patent: Mar. 27, 2001

(54) WIRING BOARD

(75) Inventors: Yuji Iino; Riichi Sasamori; Katsura Hayashi; Masaaki Hori; Hidenori Shikada; Masaaki Harazono, all of Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/428,824

(22) Filed: Oct. 28, 1999

(30) Foreign Application Priority Data

Nov. 2, 1998 (JP) .................................................. 10-311643
Nov. 30, 1998 (JP) .................................................. 10-339376
Jul. 30, 1999 (JP) .................................................. 11-217011

(51) Int. Cl.⁷ ........................................................ B32B 3/00

(52) U.S. Cl. ........................... 428/209; 174/250; 174/257; 428/901

(58) Field of Search .................................. 428/209, 321.3, 428/304.4, 901, 257, 250; 174/257, 255

(56) References Cited

U.S. PATENT DOCUMENTS

| 4,398,975 | * | 8/1983 | Ohsawa et al. ....................... 420/555 |
| 4,435,611 | * | 3/1984 | Ohsawa et al. ....................... 174/68.5 |
| 5,117,069 | * | 5/1992 | Higgins, III ......................... 428/901 |
| 5,346,750 | * | 9/1994 | Hatakeyama et al. ............... 428/209 |

* cited by examiner

Primary Examiner—Cathy Lam
(74) Attorney, Agent, or Firm—Hogan & Hartson, LLP.

(57) ABSTRACT

A wiring board comprising an insulating substrate containing at least an organic resin, a plurality of electrically conducting wiring layers formed on the surface and/or inside of said insulting substrate, and via-hole conductors formed in said insulating substrate in order to electrically connect the plurality of electrically conducting wiring layers, wherein said via-hole conductors contain an organic binder as well as a Cu—Sn intermetallic compound as an electrically conducting component. The via-hole conductors formed in the wiring board exhibit a high electric conductivity and a large heat resistance, making it possible to very highly reliably connect the electrically conducting wiring layers together.

10 Claims, 3 Drawing Sheets

WIRING BOARD

BACKGROUND OF THE INVENTION

1. Field of the Invention

The present invention relates to a wiring board comprising an insulating substrate containing at least an organic resin, and via-hole conductors formed by filling the via-holes with an electrically conducting material, in order to decrease the resistance of the via-hole conductors and to improve the reliability of connection.

2. Description of the Prior Art

In recent years, a so-called printed board having an electrically conducting wiring layer formed on the surface of an insulating substrate that contains a thermosetting resin such as epoxy resin or phenol resin, has been applied to a circuit board and a package that mounts a semiconductor device. In order to form an electrically conducting wiring layer on the printed board, there have been employed a method by which a copper foil is adhered onto the surface of an insulating substrate which is then etched to form a wiring pattern, a method by which a copper foil forming a wiring pattern is transferred onto the insulating substrate, and a method by which a wiring pattern is formed on the surface of the insulating substrate based on a metal-plating method.

As the wirings are formed in many layers, further, it has been attempted to electrically connect different electrically conducting wiring layers using via-hole conductors. Generally, however, the via-hole conductors are formed by forming via-holes in the insulating substrates of the multi-layer wiring board at predetermined portions by using a drill or the like and plating a metal onto the inner walls of the via-holes.

According to the above-mentioned methods, however, expensive chemicals are used for conducting the chemical plating, and extended periods of time are required for the treatment, offering difficulty in the production and economy. Further, the via-hole conductors obtained by plating a metal on the inner walls cannot be easily formed among the layers in the multi-layer structure arousing a problem in that it is not possible to increase the density of the conductor wiring layers.

To cope with such a problem in recent years, there have been proposed methods in which electrically conducting wiring layers are formed in many layers by coating the surface of the insulating substrate with, and by filling the via-holes with, an electrically conducting paste obtained by mixing a metal powder such as of silver, copper or solder and a thermosetting resin or an activating agent as taught in Japanese Patent No. 2603053, Japanese Examined Patent Publication (Kokoku) No. 39360/1993 and Japanese Unexamined Patent Publication (Kokai) No. 160072/1980.

According to the conventional method of forming via-hole conductors by filling an electrically conducting paste, however, a thermosetting resin component is contained in large amounts in the electrically conducting paste and the contact is not sufficient among metal particles in the via-hole conductors; i.e., the electric conductivity of the via-hole conductors is low.

The object of the present invention, therefore, is to provide a wiring board having an insulating substrate equipped with via-hole conductors that have a high electric conductivity and can be easily formed in any place, featuring very high reliability in the electric connection among the electrically conducting wiring layers.

Another object of the present invention is to provide a wiring board having an insulating substrate equipped with via-hole conductors that exhibit the above-mentioned properties as well as excellent heat resistance.

According to the present invention, there is provided a wiring board comprising an insulating substrate containing at least an organic resin, a plurality of electrically conducting wiring layers formed on the surface and/or inside of said insulating substrate, and via-hole conductors formed in said insulating substrate in order to electrically connect the plurality of electrically conducting wiring layers, wherein said via-hole conductors contain an organic binder as well as a Cu—Sn intermetallic compound as an electrically conducting component.

The Cu—Sn intermetallic compounds include $Cu_3Sn$ and $Cu_6Sn_5$. In the present invention, however, $Cu_3Sn$ is particularly preferably used. That is, in the wiring board of the present invention, the Cu—Sn intermetallic compound is formed as an electrically conducting component in the via-hole conductors. Therefore, the via-hole conductors exhibit a high electric conductivity, e.g., a volume resistivity of not larger than $1 \times 10^{-5}$ Ω-cm, offering a very high reliability in the electric connection among the electrically conducting wiring layers. Besides, the Cu—Sn intermetallic compound exhibits excellent heat resistance. When the wiring board is maintained, for example, at 260° C. for two minutes, the volume resistivity is maintained to be not larger than $1 \times 10^{-4}$ Ω-cm. Therefore, the connection condition between the via-hole conductors and the electrically conducting wiring layers does not change and a stably connected state is maintained even when the wiring board is heated at high temperatures during the step of reflowing or during the testing of reliability. When a low-melting metal or alloy such as silver or solder is used as an electrically conducting material, the connection condition between the via-hole conductors and the electrically conducting wiring layers changes and the reliability of connection decreases due to a high temperature during the step of reflowing or during the testing of reliability. According to the present invention, however, such a problem is effectively solved.

DETAILED DESCRIPTION OF THE INVENTION

The invention will now be described in detail based on the embodiments shown in the accompanying drawings.

Figure 1:
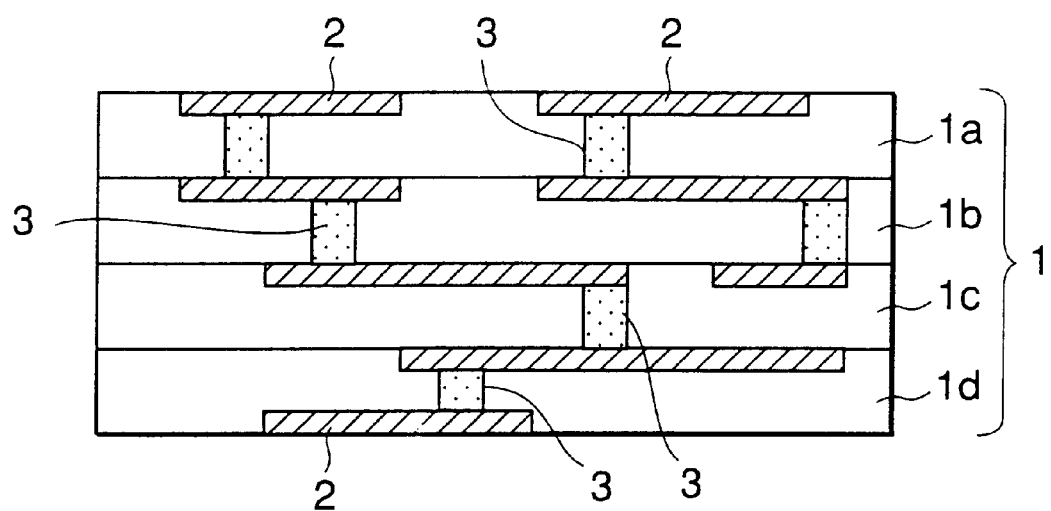
FIG. 1 is a diagram illustrating a sectional structure of a wiring board of the present invention.

Referring to FIG. 1 illustrating a sectional structure of a wiring board of the present invention, the wiring board is constituted by an insulating substrate 1 containing an organic resin, electrically conducting wiring layers 2, and via-hole conductors 3. The insulating substrate 1 is formed by laminating four pieces of insulating layers 1a, 1b, 1c and 1d, and the electrically conducting wiring layers 2 are formed on the surfaces of the insulating layers 1a to 1d, the electrically conducting wiring layers being electrically connected together through the via-hole conductors 3.

(Insulating Substrate 1)

The insulating layers 1a to 1d constituting the insulating substrate 1 are formed of a material containing at least an organic resin. As the organic resin, there can be used a thermosetting resin such as polyphenylene ether (PPE), bismaleimidetriazine resin (BT resin), epoxy resin, polyimide resin, fluorine-contained resin or phenol resin. Among them, it is desired to use a thermosetting resin having a glass transition point of not lower than 180° C.

In order to enhance the strength of the wiring board, further, it is desired to disperse a filler in the organic resin. The organic resin and the filler are generally used at a volume ratio of from 30:70 to 70:30. As the filler, there can be exemplified an inorganic filler such as $SiO_2$, $Al_2O_3$, $ZrO_2$, $TiO_2$, AlN, SiC, $BaTiO_3$, $SrTiO_3$, zeolite or $CaTiO_3$ as well as a fibrous filler such as nonwoven fabric or woven fabric comprising a glass or an aramid resin. Among them, an inorganic filler is particularly suited. The fibrous filler exhibits an excellent strength but lacks the property of being homogeneously dispersed. When the via-holes are formed in the insulating layer containing the fibrous filler, therefore, dispersion occurs in the diameter of the holes. When the glass woven fabric is used, in particular, water diffuses on the interface between the glass woven fabric and the organic resin when the wiring board is preserved in a highly humid atmosphere for extended periods of time, resulting in the occurrence of migration. When the inorganic filler is used, it is desired that the filler has nearly a spherical shape and an average particle diameter which is not larger than 20 $\mu$m, preferably, not larger than 10 $\mu$m and, most preferably, not larger than 7 $\mu$m from the standpoint of being homogeneously dispersed in the organic resin.

The thicknesses of the insulating layers 1a to 1d are desirably from 10 to 300 $\mu$m and, particularly desirably, from 40 to 100 $\mu$m. When the thicknesses are smaller than the above-mentioned range, moisture in the atmosphere may infiltrate and diffuse into the insulating layers. When the thicknesses are larger than the above-mentioned range, on the other hand, the wiring board becomes too thick giving disadvantage from the standpoint of decreasing the size and weight of the wiring board.

(Electrically Conducting Wiring Layers 2)

The electrically conducting wiring layers 2 can be formed of any conductor and are, desirably, formed of copper, aluminum, gold, silver or an alloy thereof. It is particularly desired that the electrically conducting wiring layers 2 are formed by machining a metal foil of copper or an alloy containing copper and having a thickness of from 5 to 40 $\mu$m from the standpoint of sealing both ends of the via-hole conductors 3 to prevent the effect of the external air and obtaining excellent electric connection relative to the via-hole conductors 3.

(Via-Hole Conductors 3)

In the present invention, the via-hole conductors 3 are formed by filling the via-holes formed at predetermined positions in the insulating layers 1a to 1d with a paste obtained by dispersing an electrically conducting component in an organic binder. In particular, the via-hole conductors 3 contain a Cu—Sn intermetallic compound as an electrically conducting component and exhibits excellent heat resistance and high electric conductivity. As the electrically conducting component, there may be contained a conductor other than the Cu—Sn intermetallic compound, such as Cu, Sn, Zn, Bi, Ag or an alloy thereof (e.g., Sn—Zn, Sn—Bi).

Further, the Cu—Sn intermetallic compound can be formed by reacting Cu with Sn by heat-treating a metal containing Cu or Sn or an alloy thereof. As described earlier, the Cu—Sn intermetallic compound is $Cu_3Sn$ (crystalline compound in which Cu and Sn are bonded at a ratio of 3/1) or $Cu_6Sn_5$ (crystalline compound in which Cu and Sn are bonded at a ratio of 6/5). Usually, $Cu_3Sn$ and $Cu_6Sn_5$ can exist together. The formation of the Cu—Sn intermetallic compound can be confirmed by the X-ray diffraction (the X-ray diffraction image exhibits a peak of $Cu_3Sn$ near a spacing (2$\theta$) of 57.5° and a peak of $Cu_6Sn_5$ near a spacing (2$\theta$) of 60°). By observing the cross section of the via-hole conductors through a scanning electron microscope, further, it is allowed to determine the amounts of $Cu_3Sn$ and $Cu_6Sn_5$. In the scanning electron microphotograph (SEM photograph) of the section of the via-hole conductor, for example, the presence of $Cu_3Sn$, $Cu_6Sn_5$ and unreacted Cu can be clearly judged depending on the density of color. Their color becomes darker in order of $Cu_3Sn$, $Cu_6Sn_5$ and Cu. Further, the unreacted Sn can be confirmed as an aggregation of Sn.

In the present invention, it is desired that the ratio of the area of the Cu—Sn intermetallic compound phase ($Cu_3Sn$ phase+$Cu_6Sn_5$ phase) calculated by the SEM photograph of the cross section of the via-hole conductor 3 to the area of the whole conductor component phase ($Cu_3Sn$ phase+$Cu_6Sn_5$ phase/whole conductor component phase), is not smaller than 0.3 and, particularly, not smaller than 0.5. That is, when the content of the Cu—Sn intermetallic compound is smaller than the above-mentioned range, the via-hole conductor lacks heat resistance and electric property.

In the present invention, it is desired that $Cu_3SN$ is contained in an amount as much as possible from the standpoint of heat resistance, and it is desired that the ratio of the area of the $Cu_6Sn_5$ phase to the area of the $Cu_3Sn$ phase ($Cu_6Sn_5/Cu_3Sn$) as measured by the SEM photograph of the section is not larger than 0.65, particularly, not larger than 0.60 and, most desirably, not larger than 0.55.

The via-hole conductor 3 containing the above-mentioned Cu—Sn intermetallic compound as an electrically conducting component exhibits favorable electrically conducting property and heat resistance, and exhibits a volume resistivity of, for example, not larger than $1 \times 10^{-5}$ $\Omega$-cm and a volume resistivity of not larger than $1 \times 10^{-4}$ $\Omega$-cm when maintained at 260° C. for two hours. Therefore, even after the repetition of the reflow (conducted at a temperature of from 240 to 260° C.) or the heat resistance testing, the electric conductivity changes very little and a very highly reliable connection is accomplished among the electrically conducting wiring layers 2 by the via-hole conductors 3 as demonstrated by Examples appearing later.

The via-hole conductors 3 can be formed in a manner as described below.

First, an electrically conducting powder, an organic binder and, as required, a suitable solvent are mixed together to prepare a paste that is to be poured into the via-holes formed at predetermined positions in the insulating layers.

As the electrically conducting powder, use is made of a copper-containing powder such as a copper powder, a copper powder coated with silver or a powder of a copper-silver intermetallic compound, and a tin-containing powder such as a tin powder, a Pb—Sn alloy powder or a Bi—Sn alloy powder. It is desired that the copper-containing powder and the tin-containing powder are used in such amounts that the weight ratio of Sn to Cu expressed by the following formula (1), $$Sn/(Cu+Sn) \qquad (1)$$

is from 0.25 to 0.75, particularly, from 0.30 to 0.70 and, most desirably, from 0.35 to 0.65 (i.e., the via-hole conductor contains Sn and Cu at a weight ratio within the above-mentioned range). By using the copper-containing powder and the tin-containing powder at such a ratio, it is allowed to promote the formation of the Cu—Sn intermetallic compound and, particularly, $Cu_3Sn$ through the heat-treatment that will be described later. When the weight ratio lies outside the above-mentioned range, the amount of the unreacted Sn or Cu so increases that it becomes difficult to form the Cu—Sn intermetallic compound in a sufficiently large amount. It is further desired that the copper-containing powder has an average particle diameter of from 0.5 to 5 $\mu$m. When the copper-containing powder having diameters smaller than the above range is used, the surfaces thereof are oxidized and the electrically conducting powder loses electric conductivity. When the copper-containing powder having diameters larger than the above range is used, the via-holes are filled with the electrically conducting powder in decreased amounts, which may result in an increase in the electric resistance of the via-hole conductors. It is desired that the tin-containing powder has an average particle diameter of from 1 to 15 $\mu$m. When the tin-containing powder having a diameter smaller than this range is used, the electric conductivity decreases due to the oxidization of the surfaces thereof. When the tin-containing powder having a diameter larger than this range is used, the via-holes are filled with the electrically conducting powder in decreased amounts and tin is localized in the via-hole conductors causing the via-hole conductors to lose the heat resistance.

Other metal powders or alloy powders may be used, as required, together with the above-mentioned copper-containing powder or the tin-containing powder so far as the Cu—Sn intermetallic compound is formed in a sufficient amount in the via-hole conductors and so far as the via-hole conductors do not lose electric conductivity and heat resistance.

As the organic binder, there can be used a thermosetting resin such as epoxy resin, phenol resin, unsaturated polyester resin or tricyanulate resin, or a cellulose resin. From the standpoint of heat resistance, adhesiveness, preservation property, weatherability and dispersing property of the electrically conducting powder, however, it is desired to use an epoxy resin or a triallylisocyanulate resin that cures with a curing agent such as amine or acid anhydride. It is desired that the organic binder is used in an amount of from 1 to 15 parts by weight per 100 parts by weight of the above-mentioned electrically conducting component (total amount of the electrically conducting powders). The organic binder may be blended with a component that reacts with a thermosetting resin contained in the above-mentioned insulating layer, i.e., with a polyfunctional compound such as triallylisocyanulate (TAIC), triglycylaminophenol (TGAP) or triallylcyanulate (TAC). That is, when the via-holes are filled with the electrically conducting paste containing the above-mentioned organic binder, the organic binder before being cured may ooze into the insulating layer to deteriorate the insulating property of the insulating layer. Upon being blended with the polyfunctional compound, however, a reaction product of the polyfunctional compound and the thermosetting resin in the insulating layer is formed on the wall surfaces of the via-holes, effectively preventing the organic binder from oozing into the insulating layer. It is also allowable to use the polyfunctional compound as the organic binder. That is, the above-mentioned polyfunctional compounds have melting points lying over a range of from −15° C. to 40° C. (TAIC has a melting point of 24° C., TAC has a melting point of 27° C., and TGAP has a melting point of −20° C.) and are capable of adjusting the viscosity of the electrically conducting paste to be the one adapted for being filled in the via-holes without quite using a solvent that will be described later. The solvent that will be described later is volatilized and removed by the heat treatment for curing the insulating layers or for forming the Cu—Sn intermetallic compound. As the solvent volatilizes, however, voids are formed in the via-hole conductors. Therefore, use of the above-mentioned polyfunctional compound as an organic binder effectively prevents the formation of voids that stem from the use of a solvent, which is an advantage.

As described above, the solvent that is used as required works to adjust the viscosity of the electrically conducting paste to lie on a suitable range and to improve the efficiency of the operation for filling the via-holes with the electrically conducting paste. The solvent is capable of dissolving the organic binder, such as isopropyl alcohol, terpineol, 2-octanol and butylcarbitol acetate. It is, however, desired that the solvent is used in an amount of usually not larger than 4 parts by weight per 100 parts by weight of the total amounts of the electrically conducting powders. When the solvent is used in large amounts, voids are formed in the via-hole conductors 3 due to the volatilization of the solvent.

A mixture of the above-mentioned electrically conducting powder, organic binder and, as required, solvent, is kneaded by using a stirrer/defoamer or a three-roll mill to prepare an electrically conducting paste for forming the via-hole conductors. In the thus prepared electrically conducting paste, the electrically conducting powder has been dispersed in the organic binder making it possible to effectively prevent the electrically conducting powder from being oxidized by the subsequent heat treatment.

The via-holes formed at predetermined positions in the insulating layers 1a to 1d are filled with the thus obtained electrically conducting paste which is then heat-treated to form the desired via-hole conductors 3. The above-mentioned heat-treatment is conducted in order to form the above-mentioned Cu—Sn intermetallic compound by the reaction of Cu and Sn contained in the electrically conducting powder. In the heat treatment, the upper-limit temperature is the melting point of the Sn-containing powder and the lower-limit temperature is lower than this melting point by 40° C. When, for example, the Sn powder is used as the Sn-containing powder, the heat treatment is conducted at a temperature of not lower than about 190° C. since the Sn powder has a melting point of 232° C. When a solder powder such as of Pb—Sn is used as the Sn-containing powder, the melting point differs depending on the ratio of Pb and Sn. Depending on the ratio, therefore, the heat treatment may be conducted at a temperature at which the solder powder melts half or melts completely. Further, in order to promote the formation of $Cu_3Sn$ and to decrease the ratio of the area of the $Cu_6Sn_5$ phase to the area of the $Cu_3Sn$ phase ($Cu6Sn5/Cu_3Sn$) to be not larger than 0.65, it is desired to conduct the heat treatment at a temperature of not lower than 210° C. (particularly, not lower than 220° C.) for not less than one hour.

(Preparation of the Wiring Board)

Figure 2:
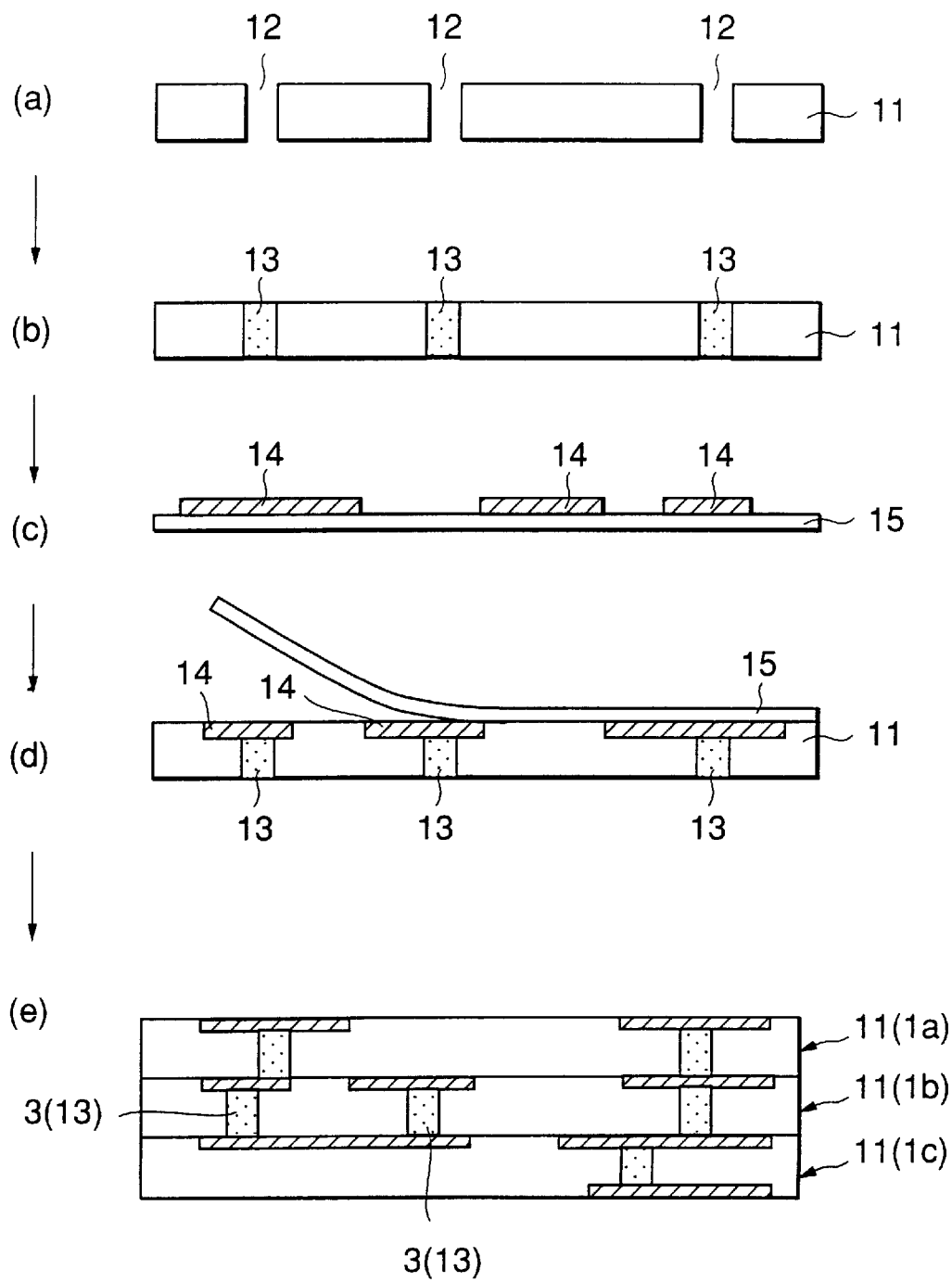
FIG. 2 is a diagram illustrating a process for producing the wiring board of FIG. 1.

The wiring board shown in FIG. 1 is prepared by a process shown in, for example, FIG. 2.

First, an uncured or half-cured soft insulating sheet 11 (corresponding to insulating layers 1a to 1d) is prepared, and via-holes 12 are formed at predetermined positions in the insulating sheet 11 by a laser working or by using a micro drill (see FIG. 2(*a*)). That is, the via-holes 12 are formed being corresponded to the positions of the electrically conducting wiring layers formed on the front surfaces or on the back surfaces of the insulating layers 1a to 1d.

The insulating sheet 11 is obtained, for example, by preparing a mixture which contains a thermosetting resin or contains the thermosetting resin and an inorganic filler by using a kneader or a three-roll mill and by forming this mixture into a sheet by the rolling method, extrusion method, injection-molding method or doctor blade method.

The via-holes 12 can be formed by punching or laser working. From the standpoint of precision, however, it is desired to form the via-holes 12 by laser working based on the carbonic acid gas or the like. When the via-holes having a diameter in excess of 300 $\mu$m are to be formed by laser working, however, the resin in the insulating sheet 11 surrounding the via-holes burns due to the heat of laser beam and the residue may adhere around the via-holes. When large via-holes are to be perforated, therefore, it is desired to use a drill.

In forming the via-holes by laser beam, further, a great dispersion in the energy of the laser beam creates a difference in the diameter of the via-holes between the side on where the laser beam is incident and the side from where the laser beam goes out. For example, when the dispersion exceeds ±1 millijoule, the difference in the diameter of the via-hole between the incidence side and the outgoing side, i.e., the difference in the diameter of the hole expressed by (hole diameter of the outgoing side/hole diameter of the incidence side)×100 (%), becomes smaller than 70% which is the permissible limit. It is therefore desired that the dispersion in the energy of the laser beam is not larger than ±1 millijoule.

When the pulse interval of the laser beam falling on the same via-hole is shorter than $2\times10^{-5}$ seconds, the resin in the insulating layer burns and the residue thereof tends to remain around the via-holes. It is therefore desired that the pulse interval is not shorter than $2\times10^{-5}$ seconds. An increase in the pulse interval makes it possible to form via-holes favorably resulting, however, in a decrease in the productivity. It is therefore desired to set the pulse interval to be not longer than $2\times10^{-3}$ seconds.

The thus formed via-holes 12 are filled with the above-mentioned electrically conducting paste 13 for forming the via-hole conductors (see FIG. 2(b)). The electrically conducting paste 13 can be easily filled by, for example, the screen-printing method.

Next, the electrically conducting wiring layers are formed in the shape of a circuit pattern. The electrically conducting wiring layers can be formed by:

1) sticking a metal foil onto the surface of the insulating sheet, followed by etching to form the metal foil in the shape of a circuit pattern thereby to form the electrically conducting wiring layers;

2) forming a resist on the surface of the insulating sheet and forming the electrically conducting wiring layers in the shape of a circuit pattern by plating a metal; or 3) sticking a metal foil on the surface of the a transfer sheet, forming a circuit pattern of the metal foil by etching, and transferring the metal foil of the shape of the circuit pattern onto the surface of the insulating sheet.

Here, however, it is desired to form the electrically conducting wiring layers by the transfer method (3) described above in compliance with FIGS. 2(c) and 2(d). According to the transfer method, the insulating sheet needs not be immersed in the etching solution or in the plating solution and, hence, no chemical solution infiltrates into the via-hole conductors. Besides, the electrically conducting wiring layers can be buried in the surface of the insulating sheet, making it possible to obtain a wiring board having excellent smoothness.

That is, referring to FIG. 2(c), a metal foil is stuck with an adhesive to the surface of the transfer sheet 15, a resist is applied in the shape of a circuit pattern onto the surface of the metal foil, followed by etching and removal of the resist, thereby to form the electrically conducting wiring layers 14 in the shape of the wiring pattern on the transfer sheet 15. It is here desired that the surface of the metal foil (exposed surface that is not adhered onto the transfer sheet) is coarsened by etching so as to possess the surface coarseness Ra (JIS B 0601) of from 0.1 to 5 $\mu$m and, particularly, from about 0.2 to about 4 $\mu$m.

Referring next to FIG. 2(d), the transfer sheet 15 on which the electrically conducting wiring layers 14 are formed is press-adhered in position onto the surface of the soft insulating sheet 11 having via-holes 12 filled with the electrically conducting paste 13. The transfer sheet 15 is then peeled off so that the electrically conducting wiring layers 14 are transferred onto the surface of the insulating sheet 11. In this case, the press-adhesion is conducted under a pressure of not lower than 20 kg/cm$^2$ and at a temperature of from 60 to 140° C. Upon conducting the press-adhesion under such conditions, the electrically conducting wiring layers 14 on the transfer sheet 15 are easily buried in the surface of the soft insulating sheet 11 that is uncured or half cured, and the surfaces of the transferred electrically conducting wiring layers 14 become in flush with the surface of the insulating sheet 11. Besides, since the via-hole conductor can be compressed, the density of the via-hole conductor can be increased to make its resistivity. In the step of FIG. 2(c), further, the surface of the metal foil is coarsened, so that the electrically conducting wiring layers 14 firmly bite into the surface of the insulating sheet 11, whereby the electrically conducting wiring layers 14 and the insulating sheet 11 are intimately adhered together maintaining an increased strength. This prevents such an inconvenience that the electrically conducting wiring layers 14 are peeled off the surface of the insulating sheet 11 accompanying the peeling of the transfer sheet 15.

The insulating sheets 11 are thus prepared to correspond to the insulating layers 1a to 1d that constitute the insulating substrate 1. Referring to FIG. 2(e), the insulating sheets 11 are laminated and press-adhered one upon the other, followed by heating, to completely cure the thermosetting resin in the insulating sheets 11. FIG. 2(e) illustrates the case where three insulating layers 1a, 1b and 1c are laminated.

Upon setting the heating temperature and time to lie within ranges in which the above-mentioned Cu—Sn intermetallic compound is formed, the thermosetting resin is completely cured and, at the same time, the via-hole conductors 3 containing the Cu—Sn intermetallic compound are formed through one stage of heat treatment, making it possible to obtain the wiring board of the present invention. Here, prior to laminating the plurality of insulating sheets 11, the heat treatment may be effected for each of the insulating sheets 11 to form the Cu—Sn intermetallic compound.

According to this method of producing the wiring board, the electrically conducting wiring layers are buried in the surface of the insulating sheet offering excellently smooth surface. This method is very useful for obtaining wiring boards adapted to the so-called flip-chip mounting. It is further allowed to simultaneously form the electrically conducting wiring layers and the insulating sheets, featuring very high production efficiency.

(Another Wiring Board Structure)

The above-mentioned wiring board shown in FIG. 1 basically has a structure in which the wiring layers are formed on the surfaces or inside of the insulating substrates without containing fibrous filler. The present invention, however, can be further adapted to the wiring board of a structure in which the insulating substrate is combined with a highly strong core substrate containing a fibrous filler. The structure of the wiring board using such a core substrate is shown in FIG. 3.

Figure 3:
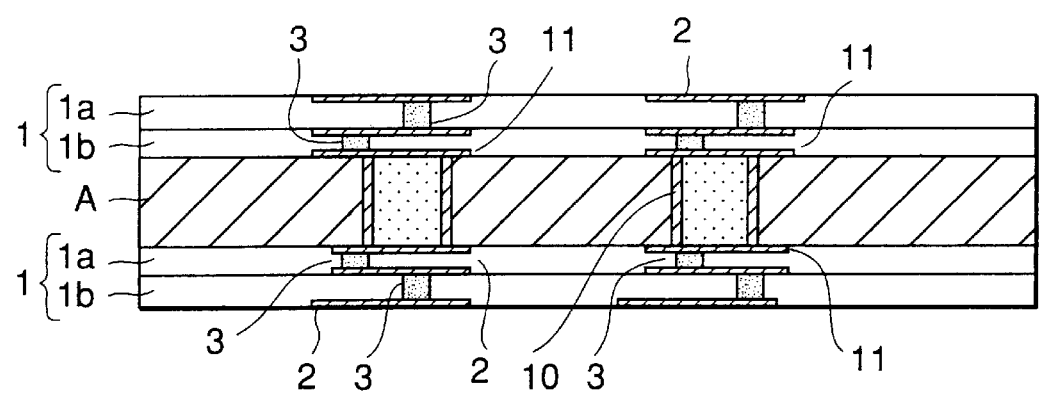
FIG. 3 is a diagram illustrating another sectional structure of the wiring board of the present invention.

In FIG. 3, the wiring board comprises an insulating core substrate A and insulating substrates 1 and 1 laminated on both surfaces thereof.

The insulating core substrate A comprises the same material as the organic resin forming the insulating layers that constitute the above-mentioned insulating substrate of FIG. 1 and, particularly, comprises a thermosetting resin. Here, however, the core substrate A contains a fibrous filler such as nonwoven fabric or woven fabric of a glass or an aramide resin, and has a very large strength. The fibrous filler is contained in the core substrate A at a ratio of organic resin:fibrous filler=30:70 to 70:30 (volume ratio). It is desired that the core board A has a thickness of usually from about 100 µm to about 2 µm from the standpoint of maintaining a large strength of the wiring board yet accomplishing a small size and a reduced weight.

The core substrate A has through-hole conductors 10 formed therein and further has wiring layers 11 and 11 formed on the upper surface and on the lower surface thereof. That is, as will be obvious from FIG. 3, the upper and lower wiring layers 11 and 11 are electrically connected together by the through-hole conductors 10. The through-hole conductor 10 comprises a metal-plated layer formed on the wall surface of the through-hole. The through-hole is filled with an organic binder 12. The organic binder 12 may be the same as the one used for forming the above-mentioned via-hole conductors 3.

The core substrate A is prepared by, for example:

i) sticking a metal foil such as of copper, aluminum or silver onto the surface of the insulating substrate;

ii) forming through-holes at predetermined positions in the insulating substrate by using a micro drill or a laser beam;

iii) plating a metal layer (through-hole conductor 10) on the wall surfaces of the through holes;

iv) applying a photosensitive resist onto the surface of the metal foil followed by exposure to light through a predetermined mask, developing, etching and removal of the resist, thereby to form the wiring layers 11; and v) filling the through-holes with the organic binder.

The insulating substrates 1, 1 laminated on the upper surface and on the lower surface of the core substrate A are each constituted by a laminate of insulating layers 1a and 1b without containing fibrous filler and has, basically, the same structure as the insulating substrate constituting the above-mentioned wiring board of FIG. 1. Electrically conducting wiring layers 2 are formed on the surfaces of the insulating substrates 1 and between the insulating layers 1a and 1b. The electrically conducting wiring layers 2 are electrically connected together through the above-mentioned via-hole conductors 3, and the electrically conducting wiring layers 2 are connected to the wiring layers 11 of the core substrate A through the above-mentioned via-hole conductors 3.

In the thus constituted wiring board, it is desired that the insulating layers 1a and 1b have a coefficient of thermal expansion which is different from that of the core substrate A by not more than 20 ppm/° C. and, particularly, not more than 10 ppm/° C. When the difference in the coefficient of thermal expansion is larger than the above-mentioned range, the wiring board may be deformed such as being warped due to the difference in the coefficient of thermal expansion when the thermal stress is given to the wiring board. It is further desired that the insulating layers 1a and 1b have a coefficient of contraction by curing of from 0.05 to 2% and, particularly, from 0.1 to 1%. When the coefficient of contraction by curing is larger than the above-mentioned range, the positions of the via-hole conductors 3 may deviate accompanying the curing of the insulating layers 1a and 1b. The difference in the coefficient of thermal expansion and the difference in the coefficient of contraction by curing can be adjusted by selecting a suitable thermosetting resin depending on the composition of the core substrate A, and blending it with a suitable amount of an inorganic filler thereby to form the insulating layers 1a and 1b. The coefficient of contraction by curing decreases with an increase in the blending amount of the inorganic filler. It is further desired that the thickness of the insulating substrate 1 constituted by the insulating layers 1a and 1b is not larger than two-thirds and, particularly, not larger than one-half of the thickness of the core substrate A. When the insulating board 1 has a large thickness, the wiring board tends to be easily deformed due to the difference in the coefficient of thermal expansion from that of the core substrate A and due to the contraction of the insulating layers 1a, 1b by curing. When the above-mentioned insulating substrate 1 is to be formed on one surface of the core substrate A, in particular, the thickness of the insulating substrate 1 should be set to lie within the above-mentioned range.

The above-mentioned wiring board of FIG. 3 can be easily produced by utilizing the transfer method shown in FIG. 2.

That is, insulating sheets having the electrically conducting wiring layers 2 formed to correspond to the insulating layers, are prepared according to the processes of FIGS. 2(a) to 2(d), and are laminated and press-adhered onto both surfaces of the core substrate A, followed by a predetermined heat treatment thereby to thermally cure the thermosetting resin constituting the core substrate and the insulating sheets and to form the Cu—Sn intermetallic compound in the via-hole conductors 3.

Like the wiring board of FIG. 1, the thus obtained wiring board offers advantages such as improved reliability in the connection based on the via-hole conductors, excellently smooth surface, large strength, and little deformation caused by thermal stress.

The above-mentioned invention can be designed in a variety of other ways. In the wiring boards of FIGS. 1 and 3, for example, there is no particular limitation on the number of the insulating layers constituting the insulating substrate. Depending on the cases, the insulating substrate may be formed by a single insulating layer. In the wiring board of FIG. 3, further, the insulating substrate may be formed on one surface only of the core substrate. In this case, neither the through-hole conductors nor the wiring layers need be formed in the core substrate.

EXAMPLES

A wiring board of a single layer was prepared as described below in order to evaluate the properties of the via-hole conductors of the present invention.

First, 4.0 parts by weight of an epoxy resin (thermosetting resin) derived from a bisphenol A and containing an amine-type curing agent and 2.0 parts by weight of a 2-octanol (solvent), were added to a metal component prepared by mixing a silver-coated copper powder (average particle diameter of 5 µm, silver content of 6% by weight) and Sn-containing powders shown in Table 1 at ratios shown in Table 1. The mixture was kneaded with a three-roll mill to prepare an electrically conducting paste. (Samples Nos. 16 and 17 were prepared by using an Sn-containing powder composed of amorphous Pb—Sn—Cu.)

On the other hand, via-holes having a diameter of 200 μm were formed by using a micro drill in an insulating sheet of a stage B comprising 40% by volume of a polyphenylene ether resin and 60% by volume of silica, and were filled with the electrically conducting paste prepared above.

An electrically conducting wiring layer of a copper foil having a thickness of 12 μm was stuck by the transfer method onto both surfaces of the insulating sheet in the stage B in which the electrically conducting paste has been buried, the electrically conducting wiring layer being stuck in a manner to hold both ends of the via-hole conductors. Then, the heat treatment was conducted under the conditions shown in Table 1 to stably cure the thermosetting resin.

The initial volume resistivities of the via-hole conductors after the heat treatment were measured to obtain results as shown in Table 1. The volume resistivities were measured across the electrically conducting wiring layers of a metal foil holding the via-hole conductors from both sides thereof.

Further, the board after the heat treatment was maintained at a temperature of 260° C. for two minutes to measure the volume resistivities of the via-holes in the same manner as described above. The results were as shown in Table 1. These resistances are shown as resistances after the heat resistance testing.

Moreover, through resistances (Test 1) after the passage of time of 1000 hours at 85° C. under a relative humidity of 85% and through resistances (Test 2) after 1000 cycles over a temperature range of from −55 to +125° C., were measured and, besides, through resistances (Test 3) after the passage of time of 1000 hours at 150° C. were measured. Changes in the resistances expressed by (resistance after testing/initial resistance)×100 (%) under the respective conditions were calculated as shown in Table 1.

The via-hole conductors of the wiring boards were observed in cross section by EPMA analysis to find the area ratios of $Cu_3Sn$ and $Cu_6Sn_5$. The results were as shown in Table 1.

As shown in Table 1, the sample No. 1 composed only of Cu had a resistance change rate of more than 10% in Tests 1 and 2, and more than 20% in Test 3. But, by producing a Cu—Sn intermetallic compound, it was possible to decrease the resistance change rare. When the weight ratio Sn/(Cu+Sn) is smaller than 0.25 (samples Nos. 1 and 2), the $Cu_3Sn$ compound fails to serve as a chief component, or a change in the volume resistivity after the heat resistance testing exceeds 10% exhibiting a low heat resistance.

In the samples Nos. 4 and 10 for which the heat-treating temperatures were too low that the Cu—Sn intermetallic compound was not formed to a sufficient degree, copper remained in large amounts, exhibiting neither excellent electric conductivity nor excellent heat resistance. In the observation of the cross section, when the area ratio of $Cu_6Sn_5$ and $Cu_3Sn$ ($Cu_6Sn_5/Cu_3Sn$) was from 0.30 to 0.65, excellent heat resistances of not larger than $1 \times 10^{-4}$ Ω-cm and high electric conductivities were exhibited even after the heat resistance testing.

In samples Nos. 16 and 17 using amorphous Pb—Sn—Cu, heat-treatment at 200° C. does not induce the reaction of Sn with Cu, the Cu—Sn intermetallic compound cannot be produced and a sufficient heat resistance could not be obtained.

TABLE 1

| Sample No. | (% by weight) (Note 1) A | B | Sn/(Cu + Sn) weight ratio | Heat treatment Temp. (° C.) | Heat treatment Time (hr) | Initial resistance ×10⁻⁵ (Ω·cm) | Resistance after heat resistance testing ×10⁻⁴ (Ω·cm) | Change in the resistance (%) Test 1 | Change in the resistance (%) Test 2 | Change in the resistance (%) Test 3 | X-ray detected crystal phase (Note 2) | Area ratio a | Area ratio b |
|---|---|---|---|---|---|---|---|---|---|---|---|---|---|
| *1 | 100 | — | 0 | 220 | 1 | 7.0 | ∞ | 10.2 | 10.5 | 21.3 | C | — | — |
| *2 | 80 | Sn—Bi—Ag—Cu 20 | 0.17 | 220 | 1 | 7.5 | 3.20 | 8.3 | 8.0 | 15.0 | $Cu, C_3S, C_6S_5$ | 0.55 | 0.45 |
| 3 | 70 | Sn—Bi—Ag—Cu 30 | 0.26 | 240 | 1 | 6.5 | 0.85 | 4.5 | 4.1 | 7.8 | $C_3S, C_6S_5, C$ | 0.43 | 0.56 |
| *4 | 50 | Sn—Bi—Ag—Cu 50 | 0.44 | 200 | 1 | 8.0 | 1.76 | 5.1 | 5.4 | 8.9 | $C_3S, C_6S_5, C$ | 0.65 | 0.40 |
| 5 | 50 | Sn—Bi—Ag—Cu 50 | 0.44 | 220 | 1 | 7.3 | 0.97 | 3.5 | 3.1 | 5.6 | $C_3S, C_6S_5, C$ | 0.57 | 0.57 |
| 6 | 50 | Sn—Bi—Ag—Cu 50 | 0.44 | 240 | 1 | 6.9 | 0.92 | 2.8 | 2.8 | 5.3 | $C_3S, C_6S_5, C$ | 0.45 | 0.63 |
| 7 | 50 | Sn—Bi—Ag—Cu 50 | 0.44 | 240 | 3 | 6.5 | 0.88 | 2.3 | 2.1 | 5.0 | $C_3S, C_6S_5, C$ | 0.33 | 0.71 |
| 8 | 50 | Sn—Bi—Ag—Cu 50 | 0.44 | 240 | 5 | 9.1 | 0.98 | 2.0 | 2.1 | 5.1 | $C_3S, C_6S_5, C$ | 0.26 | 0.79 |
| 9 | 40 | Sn—Bi—Ag—Cu 60 | 0.55 | 240 | 1 | 7.0 | 0.80 | 2.1 | 2.0 | 4.9 | $C_3S, C_6S_5, C$ | 0.41 | 0.68 |
| *10 | 60 | Pb—Sn 40 | 0.30 | 200 | 1 | 7.8 | 1.60 | 6.1 | 6.3 | 6.9 | $C, C_3S, C_6S_5$ | 0.60 | 0.37 |
| 11 | 60 | Pb—Sn 40 | 0.30 | 220 | 1 | 7.1 | 0.79 | 3.5 | 3.4 | 5.7 | $C_3S, C_6S_5, C$ | 0.53 | 0.53 |
| 12 | 60 | Pb—Sn 40 | 0.30 | 240 | 1 | 6.7 | 0.78 | 3.3 | 3.3 | 5.8 | $C_3S, C_6S_5, C$ | 0.40 | 0.60 |
| 13 | 50 | Sn 50 | 0.51 | 240 | 1 | 7.0 | 0.82 | 3.7 | 3.6 | 6.0 | $C_3S, C_6S_5, C$ | 0.43 | 0.64 |
| 14 | 50 | Sn 50 | 0.51 | 240 | 2 | 6.8 | 0.80 | 3.4 | 3.1 | 5.7 | $C_3S, C_6S_5, C$ | 0.38 | 0.68 |
| 15 | 50 | Sn 50 | 0.51 | 240 | 3 | 6.5 | 0.80 | 3.2 | 3.0 | 5.6 | $C_3S, C_6S_5, C$ | 0.34 | 0.73 |
| *16 | 55 | Pb—Sn—Cu 45 | 0.15 | 200 | 1 | 12.1 | 4.1 | 9.2 | 8.9 | 18.0 | C, Su, Pb | 0 | 0 |
| *17 | 25 | Pb—Sn—Cu 75 | 0.25 | 200 | 1 | 14.2 | 4.5 | 8.5 | 8.8 | 17.0 | C, Su, Pb | 0 | 0 |

Samples marked with * possess insufficient heat resistance.
Note 1) A: Ag-coated cupper powder B: Sn-containing powder
Note 2) C:Cu, $C_3S:Cu_3Sn$, $C_6S_5:Cu_6Sn_5$
Note 3) Area ratio a:$Cu_6Sn_5/Cu_3Sn$, Area ratio b:$(Cu_3Sn + Cu_6Sn_5)$/whole conducting material

What is claimed is:
1. A wiring board comprising:
an insulating substrate containing at least an organic resin;
a plurality of electrically conducting wire layers formed on the surface and/or inside of said insulating substrate;

via-hole conductors formed in said insulating substrate to electrically connect the plurality of electrically conducting wiring layers; and an organic binder and a Cu—Sn intermetallic compound as an electrically conducting component disposed within said via-hole conductors wherein a weight ratio of Sn and Cu as expressed by the formula Sn/(Cu+Sn) is between 0.25 and 0.75.

2. A wiring board according to claim 1, wherein said Cu—Sn intermetallic compound is at least one selected from the group consisting of $Cu_3Sn$ and $Cu_6Sn_5$.

3. A wiring board according to claim 1, wherein the area ratio of said Cu—Sn intermetallic compound to the total amount of said electrically conducting components (Cu—Sn intermetallic compound/total amount of the electrically conducting components) is not smaller than 0.3 in the observation in cross section of said via-hole conductor using a scanning electron microscope.

4. A wiring board according to claim 1, wherein said via-hole conductor has a volume resistivity of not larger than $1\times10^{-4}$ Ω-cm when it is maintained at 260° C. for two hours.

5. A wiring board according to claim 2, wherein the area ratio of $Cu_6Sn_5$ and $Cu_3Sn$ ($Cu_6Sn_5/Cu_3Sn$) is not larger than 0.65 in the observation in cross section of said via-hole conductor using a scanning electron microscope.

6. A wiring board according to claim 1, wherein said electrically conducting wiring layers are obtained by working a copper foil into the shape of a wiring pattern.

7. A wiring board according to claim 1, wherein said insulating substrate is laminated on at least one surface of an insulating core substrate that is constituted by a thermosetting resin and a fibrous filler, and that has wiring circuit layers formed on the surface thereof, said wiring circuit layers formed on said core substrate being electrically connected to the wiring circuit layers formed on said insulating substrate through said via-hole conductors.

8. A wiring board according to claim 7, wherein wiring circuit layers are formed on both surfaces of said core substrate, the insulating substrates are laminated on both surfaces of said core substrate, and the wiring circuit layers on both surfaces of said core substrate are electrically connected to the wiring circuit layers formed on said insulating substrates through said via-hole conductors.

9. A wiring board according to claim 8, wherein said core substrate has a through-hole conductor formed by plating a metal layer on the inner wall surface of a through-hole penetrating therethrough, and the wiring circuit layers on both surfaces of said core substrate are electrically connected together using said through-hole conductor.

10. A wiring board according to claim 8, wherein said insulating substrate contains a thermosetting resin having a coefficient of thermal expansion different from that of said core substrate by not more than 20 ppm/° C., and has a thickness of not larger than two-thirds of the thickness of said core substrate.

* * * * *

US006207259C1

(12) EX PARTE REEXAMINATION CERTIFICATE (5094th)
United States Patent
Iino et al.

(10) Number: US 6,207,259 C1
(45) Certificate Issued: Apr. 5, 2005

(54) WIRING BOARD

(75) Inventors: Yuji Iino, Kokubu (JP); Riichi Sasamori, Kokubu (JP); Katsura Hayashi, Kokubu (JP); Masaaki Hori, Kokubu (JP); Hidenori Shikada, Kokubu (JP); Masaaki Harazono, Kokubu (JP)

(73) Assignee: Kyocera Corporation, Kyoto (JP)

Reexamination Request:
No. 90/006,808, Oct. 10, 2003

Reexamination Certificate for:
| | |
|---|---|
| Patent No.: | 6,207,259 |
| Issued: | Mar. 27, 2001 |
| Appl. No.: | 09/428,824 |
| Filed: | Oct. 28, 1999 |

(30) Foreign Application Priority Data

| Nov. 2, 1998 | (JP) | ............................................ 10-311643 |
| Nov. 30, 1998 | (JP) | ............................................ 10-339376 |
| Jul. 30, 1999 | (JP) | ............................................ 11-217011 |

(51) Int. Cl.$^7$ ................................................ B32B 3/00
(52) U.S. Cl. ........................ 428/209; 428/901; 174/250; 174/257
(58) Field of Search ................................. 428/209, 901; 174/250, 257

(56) References Cited

U.S. PATENT DOCUMENTS

| 5,346,750 A | 9/1994 | Hatakeyama et al. ....... 428/209 |
| 5,484,647 A | 1/1996 | Nakatani et al. ............ 428/209 |
| 5,817,404 A | 10/1998 | Kawakita et al. ........... 428/209 |
| 5,948,533 A | 9/1999 | Gallagher et al. .......... 428/418 |

*Primary Examiner*—Stephen Stein

(57) ABSTRACT

A wiring board comprising an insulating substrate containing at least an organic resin, a plurality of electrically conducting wiring layers formed on the surface and/or inside of said insulting substrate, and via-hole conductors formed in said insulating substrate in order to electrically connect the plurality of electrically conducting wiring layers, wherein said via-hole conductors contain an organic binder as well as a Cu—Sn intermetallic compound as an electrically conducting component. The via-hole conductors formed in the wiring board exhibit a high electric conductivity and a large heat resistance, making it possible to very highly reliably connect the electrically conducting wiring layers together.

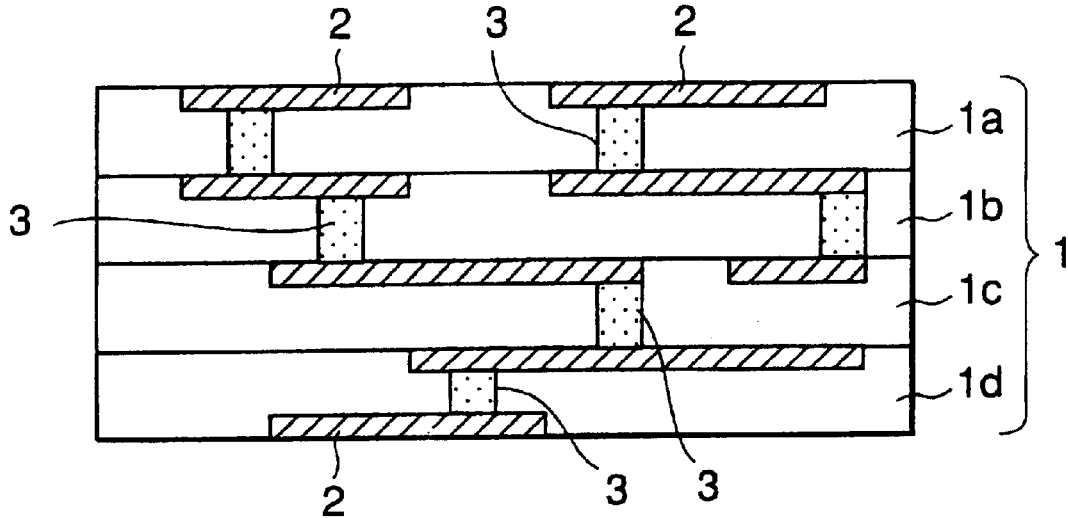

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–10 is confirmed.

* * * * *